(12) United States Patent
Scipioni et al.

(10) Patent No.: US 7,228,476 B2
(45) Date of Patent: Jun. 5, 2007

(54) SYSTEM AND METHOD FOR TESTING INTEGRATED CIRCUITS AT OPERATIONAL SPEED USING HIGH-FREQUENCY CLOCK CONVERTER

(75) Inventors: Massimo Scipioni, Portland, OR (US); Stefano Cavallucci, Portland, OR (US)

(73) Assignee: STMicroelectronics, Inc., Carrollton, TX (US)

( * ) Notice: Subject to any disclaimer, the term of this patent is extended or adjusted under 35 U.S.C. 154(b) by 172 days.

(21) Appl. No.: 10/982,275

(22) Filed: Nov. 5, 2004

(65) Prior Publication Data

US 2006/0117230 A1    Jun. 1, 2006

(51) Int. Cl.
  *G01R 31/28* (2006.01)
  *G06F 11/00* (2006.01)
(52) U.S. Cl. ...................... 714/733; 714/798
(58) Field of Classification Search ............ None
  See application file for complete search history.

(56) References Cited

U.S. PATENT DOCUMENTS

| | | | |
|---|---|---|---|
| 5,130,568 A | 7/1992 | Miller et al. ............ 307/272.2 |
| 5,181,191 A | 1/1993 | Farwell ..................... 368/113 |
| 5,226,048 A | 7/1993 | Bandali et al. ............ 371/22.1 |
| 5,353,308 A | 10/1994 | Whetsel, Jr. ............... 371/22.3 |
| 5,390,192 A * | 2/1995 | Fujieda ....................... 714/744 |
| 5,515,382 A | 5/1996 | Lassorie .................... 371/22.3 |
| 5,524,114 A | 6/1996 | Peng ......................... 371/22.1 |
| 6,195,772 B1 | 2/2001 | Mielke et al. ............. 714/724 |
| 6,223,298 B1 * | 4/2001 | Tellier et al. .............. 713/501 |
| 6,598,192 B1 | 7/2003 | McLaurin et al. ......... 714/726 |
| 6,629,281 B1 | 9/2003 | McNamara et al. ........ 714/733 |
| 6,996,759 B2 * | 2/2006 | Price ......................... 714/726 |
| 2003/0084390 A1 | 5/2003 | Tamarapalli et al. ....... 714/744 |
| 2003/0204800 A1 | 10/2003 | Flanagan et al. ........... 714/726 |
| 2005/0268191 A1* | 12/2005 | Shin ........................... 714/726 |

\* cited by examiner

*Primary Examiner*—Christine T. Tu
(74) *Attorney, Agent, or Firm*—Lisa K. Jorgenson; Christopher F. Regan

(57) ABSTRACT

A system tests an integrated circuit at operational speed. The system includes a high frequency clock converter that receives test clock signals at a speed lower than operational speed of the integrated circuit to be tested. The high frequency clock converter generates test clock signals for operational speed testing of the integrated circuit.

38 Claims, 4 Drawing Sheets

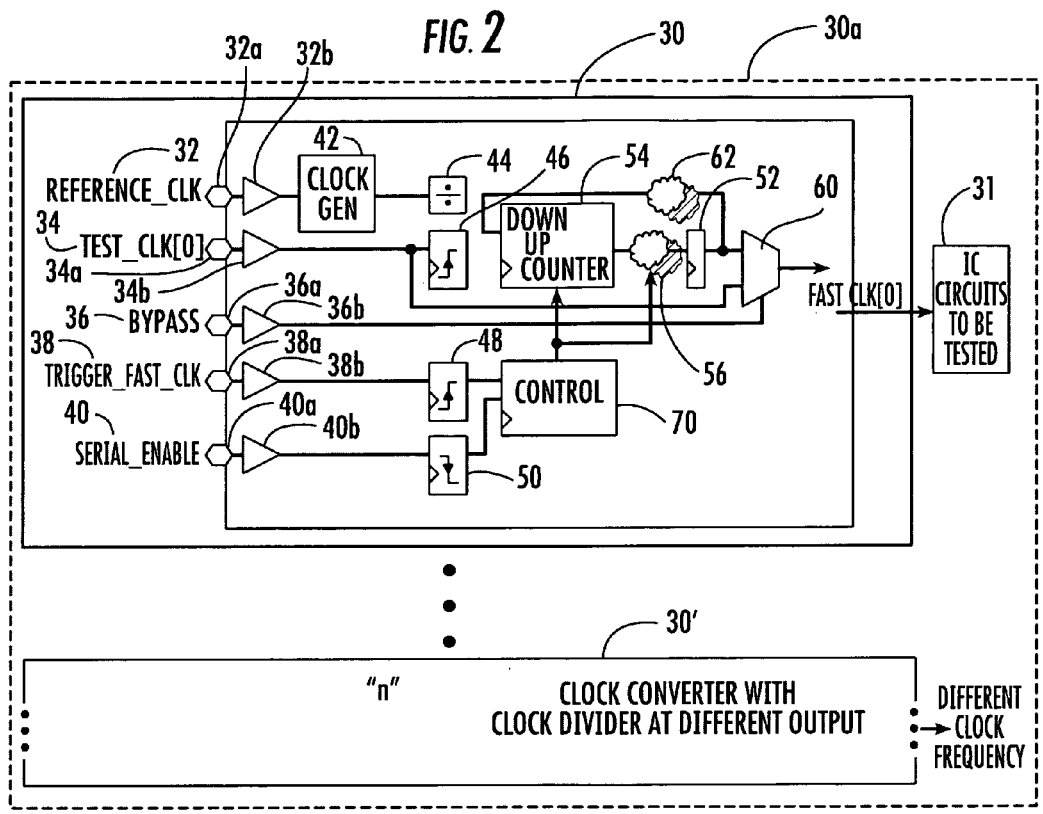
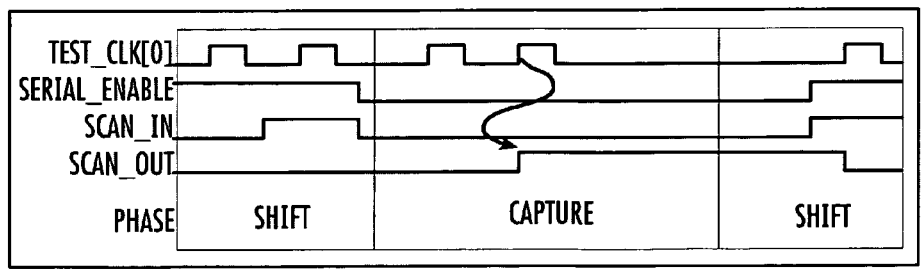
FIG. 3

SYSTEM AND METHOD FOR TESTING INTEGRATED CIRCUITS AT OPERATIONAL SPEED USING HIGH-FREQUENCY CLOCK CONVERTER

FIELD OF THE INVENTION

The present invention relates to testing integrated circuits, and more particularly, the present invention relates to testing integrated circuits at their operating speed.

BACKGROUND OF THE INVENTION

Integrated circuits have become more complicated as circuit density increases each year. As a result, more efficient testing systems and methods that minimize test costs and reduce overhead are becoming increasingly important. These integrated circuit testing systems and methods should guarantee a high fault coverage.

Some integrated circuit testing systems use Automatic Test Equipment (ATE), which inputs test patterns for a test set corresponding to a set of test vectors that are selected to ascertain the correct behavior of a circuit relative to a particular set of faults. A test pattern forms a test vector that is used for testing the circuit together with an expected response.

Some integrated circuits incorporate "Design for Testability" (DFT), which is used to increase the observability or controllability of a circuit design. The integrated circuits often include scan test registers that can be loaded in response to generated cock signals (or pulses). Test points are often introduced as additional circuit inputs and outputs. Any additional logic and test point connections, however, can be reduced by estimating a design's testability and using Automatic Test Pattern Generation (ATPG) software tools to generate tests and fault coverage. For example, different scan-test methods have been designed to partition an integrated circuit and increase observability and control of internal circuit nodes for testing. In this type of design, the "Circuit-Under-Test" (CUT), i.e., integrated circuit to be tested, typically would have two modes of operation, for example, a normal functional mode and a test mode. The change of one mode to the other could be controlled by a mode-select signal and/or by a separate test clock signal, which could be generated by the Automatic Test Pattern Generation software and any associated Automatic Test Equipment.

This type of integrated circuit test technology is based on scan chains. For example, memory elements or other logic circuits are connected into shift registers. In a normal mode, the integrated circuit elements perform regular functions, but in a scan or test mode, the different elements, such as memory elements, become scan cells that are connected together to form a number of shift registers, often called scan chains, which shift in a set of test patterns into the circuit and then shift out of the circuit (or test) the responses to the test patterns. These test responses can be compared to fault-free responses to determine if the Circuit-Under-Test (CUT) works properly.

During a test mode, the scan elements shift data along the scan chain, such as in a shift register. The test pattern is scanned or shifted into the scan filling the scan elements with data. The Circuit-Under-Test returns to its normal functional mode and a system clock causes the test pattern to be stored in the system flip-flops, and applied at primary circuit inputs to be processed by the combinational logic circuitry of the integrated circuit. In a test mode, a resulting pattern stored in a shift register can be shifted out for comparison with the expected response. The Automatic Test Pattern Generation program models the scanned flip-flops and latches to verify any resulting test patterns that are shifted out with an expected response generated from the Automatic Test Pattern Generation program.

As a result, in conventional, scan-based fault testing, some test patterns can be applied to the integrated circuit at a slower speed than the integrated circuit's functional speed. The integrated circuit can be placed in the scan or shift mode and a test pattern is shifted in from the Automatic Test Equipment. The integrated circuit is placed in the capture mode and the response captured. The integrated circuit is placed back in the shift mode and the response shifted out. In some cases, the scanning out of the integrated circuit's response for a test pattern is merged with the scanning in of subsequent test patterns to reduce test application time. This sequence can be coordinated by the external Automatic Test Equipment, which supplies clock signals in the shift and capture mode.

It should be understood that during a shift mode of operation when test patterns are loaded into scan chains in an integrated circuit core, the Automated Test Equipment can supply the clock to the core. During a capture mode, however, when at-speed testing occurs, a phase-locked loop circuit can supply clocks to the core. When switching back and forth between a shift and capture mode, a clock synchronizer can synchronize the clocks between the Automatic Test Equipment and the phase-locked loop to ensure that clock signals to the controller are stable. The input to a clock synchronizer could include phase-locked loop system clocks and a SHIFT_CLK signal from Automatic Test Equipment. Other inputs could be used to switch between the clocks. Different clock synchronization techniques could also be used.

Another type of integrated circuit test is delay fault testing that also uses a scan test to test for high-speed faults. The integrated circuit operates at its rated functional speed. The Automatic Test Equipment can supply clocks of the same frequency as functional or operational speed clocks, but this speed for Automatic Test Equipment can be difficult to achieve with very high speed integrated circuits. Usually, a functional or delayed Automatic Test Pattern Generation program uses a scan in and scan out function, e.g., data is scanned into and out of a scanned chain under test. An input or capture cycle allows any strobe or stabilized data to be transferred through the circuit logic by a system clock pulse at a desired operating speed. After an input cycle, the next scan in/out cycle begins and previous test results could be shifted out while a new test is shifted in.

Some prior art integrated circuit test systems have modified the test vectors coming from the Automatic Test Program Generation software through the use of a programmable clock generator. Such a system is disclosed in U.S. Pat. No. 6,598,192 to McLaurin, et al., the disclosure which is hereby incorporated by reference in its entirety. In that system, an integrated circuit to be tested includes a programmable clock generator, which provides clock signals to different components of the integrated circuit. This clock generator includes a phase-locked loop circuit and one or more choppers that provide a desired waveform to the integrated circuit for testing. The system is used in conjunction with the Automatic Tester Equipment, allowing the integrated circuit to be scan tested at-speed using slower and less expensive testing equipment.

This system is an improvement over other prior art systems in which the Automatic Test Pattern Generator clock data is manipulated to create waveforms that test the launch-to-capture cycle speed. For example, peripheral and core clock signals in a waveform can be created. One clock per interval can install the correct timing relationship for a test to launch the capture cycle at a desired speed. The waveform of the clock signal can be controlled based on the core clock pattern data and one pulse per interval. A second pulse can be used to launch, and a third pulse used to capture a position and simulate the fastest speed.

The Automatic Test Equipment used in these integrated circuit testing systems often is not adequate because of maximum frequency or maximum slew rate limitations associated with integrated circuit testing. As a result, a testing system, such as disclosed in the incorporated by reference '192 patent, requires that the test patterns created by the Automatic Test Pattern Generation software are at a much lower frequency and must be adapted and changed for operational speed testing. Any Test Pattern Generation Process is also dependent on the frequency of the different test clocks required to test the integrated circuit.

SUMMARY OF THE INVENTION

It is therefore an object of the present invention to provide a system and method for testing of integrated circuits at operational speed such that the test vectors coming from the Automatic Test Pattern Generation software do not have to be modified.

It is also an object of the present invention to provide a system and method for testing of integrated circuits at operational speed that does not require expensive Automatic Test Equipment.

The present invention allows testing of an integrated circuit at operational speed (at-speed) even when Automatic Test Equipment or the test environment itself does not permit at-speed testing because of maximum frequency or maximum slew rate limitations. The present invention is advantageous over prior art integrated circuit testing systems because it allows testing at operational speed using the same test patterns created by the Automatic Test Pattern Generation (ATPG) software at a much lower frequency with no test pattern change. Thus, the test pattern generation process is independent from the frequency of the different test clocks required to test the integrated circuit.

The present invention also can use external low speed test clocks generated by the Automatic Test Pattern Generation tools. High-speed clock waveforms can change dynamically during the Automatic Test Pattern Generation process. It is also possible to obtain sequences using more than two clock pulses with no modification. This allows a reduction in the number of generated test patterns and reduces the overall test time of the integrated circuit. Additionally, the present invention does not require additional fault simulations when calculating the test coverage as the ratio between the number of faults detected by the Automatic Test Pattern Generation tools and the total number of detectable faults. This value could be identical to the figure reported at the end of the at-speed Automatic Test Pattern Generation flow. Thus, there is no requirement for an accurate definition of test clock waveforms that are critical for classical Automatic Test Pattern Generation at-speed applications.

The present invention can incorporate an on-chip high frequency clock divider that uses a clock having a frequency higher than the maximum operating frequency of the logic to be tested inside the integrated circuit. It also uses a programmable clock divider and a clock synchronizer applied to the slow Automatic Test Pattern Generation clocks, which are clocked by a fast clock. Counters are used to count the number of captured clocks demanded by the Automatic Test Pattern Generation tool for each test clock and one control logic as a control block can be used per test clock.

In accordance with the present invention, the system tests an integrated circuit at operational speed and includes a source of test clock signals that are at a speed lower than the operational speed of the integrated circuit to be tested. A clock converter receives test clock signals and generates test clock signals for operational speed testing of the integrated circuit. The clock converter can be formed integral with the integrated circuit to be tested. The source of test clock signals received by the clock converter is typically external to the integrated circuit to be tested.

In one aspect of the present invention, the source of test clock signals comprises an Automatic Test Pattern Generation (ATPG) program, which is operative for creating test patterns that are propagated without modification to the integrated circuit to be tested. An Automatic Test Equipment (ATE) device can generate the test clock signals and be operative with the Automatic Test Pattern Generation program.

In yet another aspect of the present invention, the clock converter comprises a counter that is loaded during a capture phase based on the number of received clock signals and operative for generating operational speed test clock signals based on a stored value within the counter. This clock converter can also be operative for generating the operational speed test clock signals after detecting a transition of a TRIGGER_FAST_CLK signal. This clock converter can also include a clock having a frequency higher than the maximum operating frequency of the integrated circuit and a programmable clock divider that receives clock signals from the clock for clocking the clock converter. A counter can count any captured clock signals required by any Automatic Test Pattern Generation program for each test clock. A clock synchronizer can be applied to receive test clock signals and clocked by a fast clock. A plurality of clock converters can be operative for generating test clock signals at a different frequency than a respective other clock converter for operational speed testing of the integrated circuit at different frequencies.

An integrated circuit and method of the present invention are also disclosed and set forth.

BRIEF DESCRIPTION OF THE DRAWINGS

Other objects, features and advantages of the present invention will become apparent from the detailed description of the invention which follows, when considered in light of the accompanying drawings in which:

FIG. 2 is a schematic block diagram of a high frequency clock converter for an integrated circuit to be tested that uses a test clock in accordance with the present invention.

FIG. 3 is a timing diagram showing a traditional at-speed Automatic Test Pattern Generation sequence and showing two capture clock cycles.

DETAILED DESCRIPTION OF THE PREFERRED EMBODIMENTS

Figure 1:
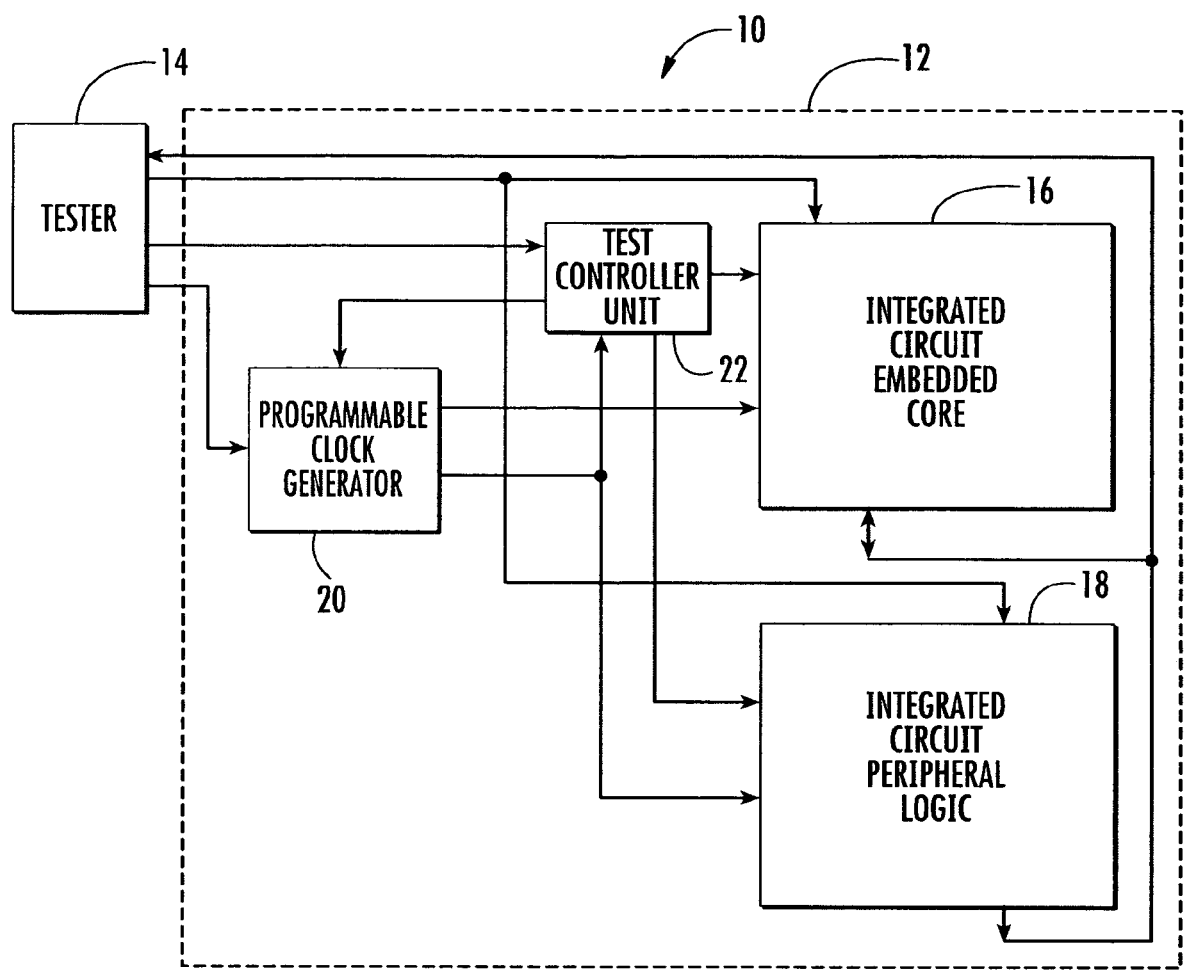
FIG. 1 is block diagram of an integrated circuit and tester used in a prior art testing system for integrated circuits, and incorporating a programmable clock generator.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

The present invention is advantageous over prior art integrated circuit test systems such as disclosed in the above-identified and incorporated by reference '192 patent, which adapts test vectors coming from Automatic Test Pattern Generation software to a programmable clock generator. In the present invention, at-speed Automatic Test Pattern Generation testing can occur without requiring an expensive Automatic Test Equipment system. The patterns generated by any standard Automatic Test Pattern Generation software tools do not have to be modified for later testing of the circuit. Thus, even when the Automatic Test Equipment or a test environment does not allow at-speed testing of an integrated circuit because of maximum frequency or minimum slew rate limitations, the present invention can still perform at-speed testing of the integrated circuit. The same test patterns created by Automatic Test Pattern Generation software can be used even if the test patterns are generated at a much lower frequency. These test patterns do not have to be changed. Thus, the test pattern generation process is independent from the frequency of the different test clocks required to test the integrated circuit at its operational speed.

Some prior art systems have relied only on high speed internal clock sources to generate the test clocks and program internal waveform generators as shift registers to a constant value throughout the entire set of test patterns. The present invention can use external, low speed test clocks generated by Automatic Test Pattern Generation software tools. Thus, the high-speed clock waveforms will be able to change dynamically during the Automatic Test Pattern Generation with little required system overhead. The present invention also makes it possible to obtain sequences using more than two clock pulses without modification, thus reducing the number of generated test patterns and reducing the test time.

The system can also calculate the test coverage defined as the ratio between the number of faults detected by the Automatic Test Pattern Generation tools and the total number of detectable faults in the circuit without requiring additional fault simulations, since the value is identical to the figure reported at the end of the at-speed Automatic Test Pattern Generation flow. There is no requirement now for an accurate definition of the test clock waveforms that were once considered critical for a classical Automatic Test Pattern Generation at-speed application.

The present invention includes a high frequency clock converter that can use a clock having a frequency higher than the maximum operating frequency of the logic to be tested inside the integrated circuit. This clock can be accomplished through the use of a phase-locked loop (PLL) or delay-locked loop (DLL) normally positioned on the integrated circuit chip. The system also could include a programmable clock divider. Clock synchronizers are applied to any slow Automatic Test Pattern Generation clocks and clocked by a fast clock. Counters can be used to count the number of capture clocks demanded by the Automatic Test Pattern Generation software tool for each test clock. Control logic is operative for one control block per test clock.

Referring now to FIG. 1, there is set forth a prior art system 10 for testing an integrated circuit in which the test vector is coming from Automatic Test Pattern Generation software and adapted or modified for use with a programmable clock generator.

As illustrated, an integrated circuit 12 is connected to Automatic Test Equipment 14. The integrated circuit 12 may include an embedded core 16 and peripheral logic 18. The drawing figure shows only one embedded core 16. Other cores could be present on the integrated circuit depending on the integrated circuit design. The peripheral logic 18 could have one clock domain but other peripheral logic blocks can be included on the integrated circuit with other clock domains. The core 16 and peripheral logic 18 typically include scan chains formed of different logic elements, for example, flip-flops, which can be used as data processing registers or scan test registers, and connected together by scan data connections. Data is shifted into the different elements until they are full. During the capture cycle, data flows through the functional logic.

A programmable clock generator 20 is connected to a test clock input to receive an input clock signal from the Automatic Test Equipment 14, providing clock signals to the core and peripheral logic. This programmable clock generator 20 can manipulate phase-locked loop (PLL) output clock signals on a cycle-by-cycle basis. A test controller unit 22 provides various control signals to the core 16, peripheral logic 18 and programmable clock generator 20. The test controller unit 22 controls the testing process in this example. A connection exists between the Automatic Test Equipment 14 and the test controller unit 22. Test control signals are provided by the Automatic Test Equipment 14 to the test controller unit 22, placing the integrated circuit 12 in a test mode.

In this prior art circuit, the programmable clock generator 20 may include a phase-locked loop circuit operative with a multiplier (PLL/multiplier) circuit that receives an input clock from the Automatic Test Equipment 14. This phase-locked loop circuit is connected to a divider/programmable chopper circuit and programmable divider/chopper circuit, which divides and chops an input clock signal by selectively eliminating certain pulses in the signal. The programmable divider/chopper circuit can divide the clock signal by an amount dependent upon a control signal from the Automatic Test Equipment. The resulting signals provide clock signals for testing. Different waveforms operative as a fast or slow clock and that have been chopped can be used for a core shift or capture cycle and a core launch cycle. During scan testing, test data is shifted into various elements forming the scan chains until elements are full. The capture cycle is performed to allow test data to flow through the functional logic. The Automatic Test Equipment can read test data. For example, with this system as described, the at-speed launch-to-capture can be tested at four times the speed of a clock signal and pulses of various signals are chopped to allow for setup of a next shift interval.

This type of prior art 10 system as described allows an integrated circuit to be tested using a slower tester. The test vector coming from the Automatic Test Pattern Generation software, however, must be modified or adapted to the programmable clock generator 20.

FIG. 2 is a schematic block diagram of a high frequency clock converter 30 of the present invention that can be incorporated on-chip 30a with the integrated circuit to be tested. This converter 30 shown in FIG. 2 can be used with one test clock. The clock converter 30 of the present invention is operative with the circuit 31 to be tested, which could include embedded core and peripheral logic, scan chains formed of different logic elements, including flip-flops, and other elements. These can all be used as data processing registers on the scan test registers and connected together by scan data connections. Data can be shifted into the different elements until they are full. During a capture cycle, data would flow through the functional logic.

Five signal inputs can be entered into the high frequency converter 30 including a REFERENCE_CLK signal 32, a TEST_CLK signal 34, a bypass signal 36, a TRIGGER_FAST_CLK signal 38, and a SERIAL_ENABLE signal 40. Each input has appropriate contacts 32a, 34a, 36a, 38a, 40a and input circuitry 32b, 34b, 36b, 38b, and 40b. The REFERENCE_CLK signal 32 can be generated from phase-locked loop (PLL) or delay-locked loop (DLL) circuit (not shown) typically on the integrated circuit chip 30a already. A clock generator circuit 42 is part of the high-frequency converter 30, and receives the REFERENCE_CLK signal 32, and together form a clock that is input into a clock divider circuit 44, which provides the clock for other functional components of the high frequency clock converter 30 of the present invention. This provided clock from the clock divider circuit 44 is used for different flip-flop and other logic circuits, including rising edge detection logic circuits 46, 48, a falling edge detection logic circuit 50, and output flip-flop circuit 52. Other components explained below can also receive this clock. Circuits 46, 48, 50, and 52 are typically formed as flip-flop circuits. The TEST_CLK signal 34, of course, can be used for changing the normal functional mode of the integrated circuit to a test mode in conjunction with the REFERENCE_CLK signal 32.

Automatic Test Pattern Generation software generates testing clock signals that can be used for the TEST_CLK signal 34. As illustrated, the TEST_CLK signal 34 is input into the rising edge detector as a flip-flop circuit 46, which drives a down/up counter 54, which outputs a signal through a logic circuit network 56 shown as a networked cloud structure and into the flip-flop circuit 52 and a multiplexer 60. The output from the flip-flop circuit 52 is also looped back through another logic circuit network 62 as a cloud of networked logic elements into the down/up counter 54 as illustrated. When the frequency converter is operative, the output from the multiplexer 60 is the FAST_CLK signal of the present invention.

The multiplexer 60 can also receive a BYPASS signal 36 in combination with the original TEST_CLK signal 34. The BYPASS signal 36 can be used for a standard phase operation when the high frequency converter 30 of the present invention is not operative. During bypass operation, the TEST_CLK signal as received from the Automatic Test Pattern Generation software is fed into the multiplexer 60, and the FAST_CLK signal from the multiplexer will actually be the TEST_CLK signal as input from the Automatic Test Pattern Generation software and slower than if the high frequency converter 30 were operative.

The BYPASS signal 36 is operative with different shifts during the testing process, including a shift phase that loads any flip-flops to form the chains as a preparation phase for a capture phase, in which the clock is normally toggled. The TRIGGER_FAST_CLK signals 38 and SERIAL_ENABLE signals 40 are input into the respective rising edge detector circuit 48 and falling edge detector circuit 50, each formed as flip-flop circuits in this non-limiting example. A control logic circuit 70 is operative as a control block with control inputs into the down/up counter 54 and the logic element network 56.

FIG. 2 shows an example of a high frequency converter 30 when the Circuit-Under-Test is under test functions with only one at-speed test clock. Any registers to be scanned can be clocked by the clock coming out of the clock divider 44 as fed by the clock generator 42 that had received the REFERENCE_CLK signal 32, such as from a phase-locked loop (PLL) or DLL circuit.

To manage more than one clock frequency, the high frequency converter circuit 32 shown in FIG. 2 is replicated as shown by the "n" high frequency clock converter 30a' having the same functional components. Any clock divider circuit on the clock generator output is set to a different value of its frequency.

It should be understood that the clock source is at a frequency higher than the maximum operating frequency of the logic to be tested inside the integrated circuit. Any clock synchronizer circuit as operative with the clock generator 42, divider 44, control logic 70 and other components are applied to the slower Automatic Test Pattern Generation clocks and are clocked by the fast clock. The down/up counter 54 counts the number of capture clocks demanded by the Automatic Test Pattern Generation tool for each test clock. The control logic 70 is operative as one control block per test clock in this non-limiting example. Naturally, if there is a chain with 100 flip-flops, then 100 clock cycles would be required for a shift.

FIG. 3 is a timing diagram for a traditional at-speed Automatic Test Pattern Generation (ATPG) sequence. The scan chains of an integrated circuit are loaded by shifting values determined by the Automatic Test Pattern Generation tool. This phase is generally called the shift phase and is qualified by a signal, called the SERIAL_ENABLE signal. When this SERIAL_ENABLE signal is 1, the testing system is in the shift phase. Once the chains have been loaded, the SERIAL_ENABLE signal goes low and two (or more) clock pulses are applied to the integrated circuit. This is called the capture phase. In order to have an "at-speed" sequence, the time distance between the rising edges of the capture clock pulses must be the same as the signals would have been during the functional operation of the logic under test. The high-speed capture clock pulses are, of course, generated by the Automated Test Equipment.

Figure 4:
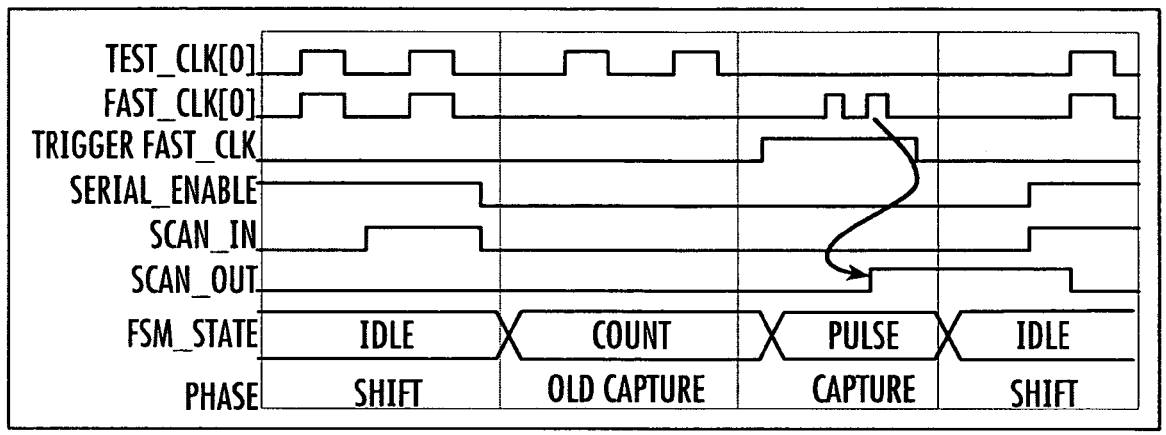
FIG. 4 is a timing diagram of the at-speed Automatic Test Pattern Generation sequence in accordance with the present invention.

FIG. 4 is the timing diagram for the integrated circuit testing system and method of the present invention. While the shift phase is identical with respect to a traditional at-speed sequence, the capture phase is now divided into two sub-phases. In the first sub-phase, called the count, any Automatic Test Equipment generates low frequency clock pulses, which are not propagated inside the integrated circuit to be tested. The pulses are used to preload the counter clocked by the at-speed clock coming from the clock generator circuit and possibly divided. When the Automatic Test Equipment is done generating the capture clock pulses, it raises the TRIGGER_FAST_CLK signal 38. The transition on the TRIGGER_FAST_CLK signal 38 is detected by a rising edge detector circuit 48 and brings the system into the second capture sub-phase, called pulse. In this phase, a number of high-speed clock pulses equal to the number of low frequency pulses the Automatic Test Equipment had set in the previous sub-phase is propagated inside the integrated circuit to be tested. Finally, a negative edge on the TRIGGER_FAST_CLK signal brings the system back into the shift phase.

Figure 5:
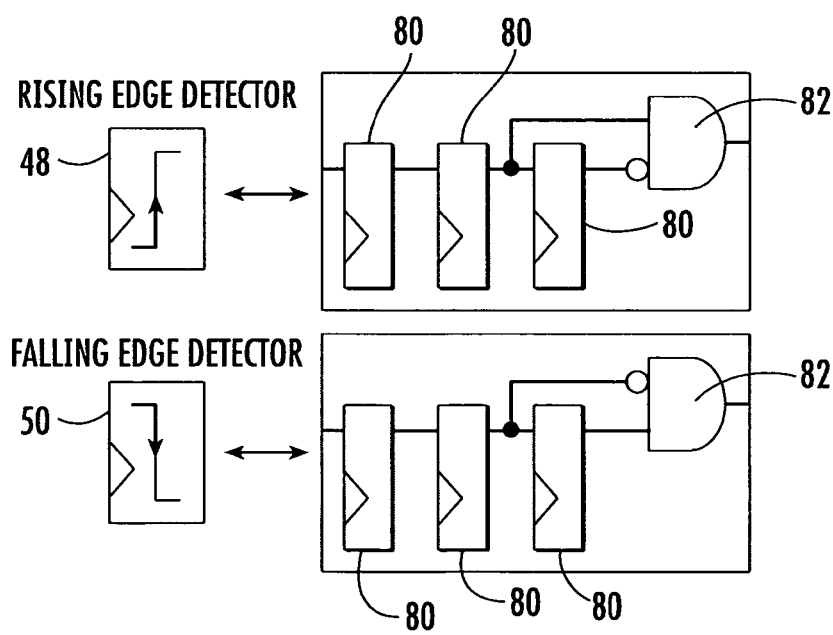
FIG. 5 is a schematic block diagram of edge detectors that could be used for the present invention as used on the SERIAL_ENABLE and TRIGGER_FAST_CLK signals.

FIG. 5 is a block diagram showing a rising edge detector 48 and falling edge detector 50 as shown in FIG. 2 formed as a series of logic circuits, for example flip-flops 80, and operative with AND gates 82 with different inverting inputs. The detectors 48,50 as illustrated are commonly known to those skilled in the art and can be modified for use in the present invention.

Figure 6:
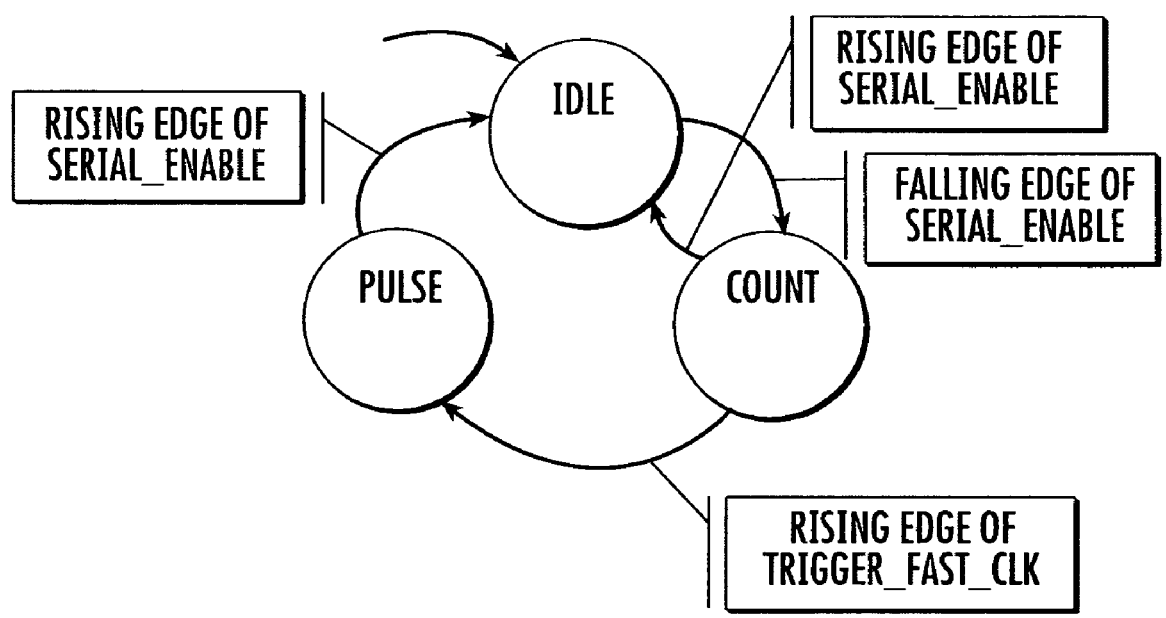
FIG. 6 is a state diagram for a control block Finite State Machine (FSM) showing the various rising and falling edges for the SERIAL_ENABLE and TRIGGER_FAST_CLK signals.

FIG. 6 shows a state diagram for the Control Block (control logic) Finite State Machine (FSM) of the present invention and shows that the system is idle and able to count with the falling edge of a SERIAL_ENABLE signal and moves into IDLE with the rising edge of a SERIAL_ENABLE signal. The rising edge of the TRIGGER_FAST_CLK signal triggers the pulse such that the system moves into IDLE with the rising edge of the SERIAL_ENABLE signal.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A system for testing an integrated circuit at operational speed, which comprises:
a test clock generator that generates test clock signals that are at a speed lower than the operational speed of the integrated circuit to be tested; and
a clock converter that receives the test clock signals and generates test clock signals for operational speed testing of the integrated circuit, and further comprising a logic circuit and detector circuit that detects a transition on a clock signal to bring the clock converter into a capture phase to propagate operational speed clock pulses through the integrated circuit to be tested at a higher speed than the test clock signals from the test clock generator.

2. A system according to claim 1, wherein said clock converter is formed integral with the integrated circuit to be tested.

3. A system according to claim 1, wherein said source of test clock signals is external to the integrated circuit to be tested.

4. A system according to claim 1, wherein said test clock generator includes an Automatic Test Pattern Generation (ATPG) program.

5. A system according to claim 4, wherein said Automatic Test Pattern Generation program creates test patterns that are propagated without modification through said integrated circuit to be tested.

6. A system according to claim 1, wherein said test clock generator comprises Automatic Test Equipment (ATE).

7. A system according to claim 1, wherein said clock converter comprises a counter that counts clock signals during a capture phase based on the number of received clock signals.

8. A system according to claim 1, wherein said clock converter generates operational speed test clock signals after detecting a transition of a TRIGGER-FAST-CLK signal.

9. A system according to claim 1, wherein said clock converter includes a clock generator having a frequency higher than the maximum operating frequency of the integrated circuit and a programmable clock divider connected to the clock generator that receives clock signals from the clock generator.

10. A system according to claim 1, wherein the clock converter further comprises a counter that counts captured clock signals required by any Automatic Test Pattern Generation (ATPG) program for each test clock.

11. A system according to claim 1, wherein the clock converter further comprises a clock synchronizer applied to received test clock signals and clocked by a fast clock.

12. An integrated circuit comprising:
a circuit that is scan tested in response to test clock signals; and
a clock converter that receives test clock signals at a speed lower than the operational speed of the circuit to be scan tested and generates test clock signals through the circuit for scan testing at operational speed, and further comprising a logic circuit and detector circuit that detects a transition on a clock signal to bring the clock converter into a capture phase to propagate operational speed clock pulses through the integrated circuit to be tested at a higher speed than the test clock signals from the test clock generator.

13. An integrated circuit according to claim 12, which further comprises an automatic test pattern generation program that generates test patterns to be propagated without modification through the circuit to be scan tested.

14. An integrated circuit according to claim 12, wherein said clock converter comprises a counter that counts during a capture phase based on the number of received clock signals, wherein said clock converter generates operational speed test clock signals based on a stored value of the number of counted clock signals within the counter.

15. An integrated circuit according to claim 12, wherein said clock converter generates the operational speed test clock signals after detecting a transition of a TRIGGER-FAST-CLK signal.

16. An integrated circuit according to claim 12, wherein said clock converter includes a clock generator having a frequency higher than the maximum operating frequency of the circuit to be scan tested and a programmable operatively connected to the clock generator clock divider that receives a test clock signal from the clock generator.

17. An integrated circuit according to claim 12, wherein the clock converter further comprises a counter that counts captured clock signals required by any Automatic Test Pattern Generation (ATPG) program for a test clock.

18. An integrated circuit according to claim 12, wherein said clock converter further comprises a clock synchronizer applied to received test clock signals and clocked by a fast clock.

19. An integrated circuit according to claim 12, and further comprising a plurality of clock converters that each generates test clock signals at a different frequency than a respective other clock converter for operational speed testing of the integrated circuit at different frequencies.

20. A method of testing an integrated circuit at operational speed, which comprises:
receiving test clock signals that are generated from a source external to the integrated circuit at a speed lower than operational speed of the integrated circuit; and generating test clock signals for operational speed testing of the integrated circuit based on the number of received test clock signals, and detecting a transition on a clock signal in a logic circuit and detector circuit to bring the clock converter into a capture phase to propagate operational speed clock pulses through an integrated circuit to be tested at a higher speed than the test clock signals from the test clock generator.

21. A method according to claim 20, which further comprises generating test clock signals using an Automatic Test Pattern Generation (ATPG) program.

22. A method according to claim 21, which further comprises creating test patterns from the Automatic Test Pattern Generation (ATPG) program that are propagated at operational speed through the integrated circuit without modification.

23. A method according to claim 20, which further comprises generating test clock signals from Automatic Test Equipment (ATE).

24. A method according to claim 20, which further comprises loading a counter with a number indicative of clock signals during a capture phase based on the number of received test clock signals.

25. A method according to claim 20, which further comprises generating a TRIGGER_FAST-CLK signal and detecting its transition for initiating the generation of the operational speed test clock signals.

26. A method according to claim 20, which further comprises shifting a capture phase after detecting a negative edge on a TRIGGER_FAST-CLK signal.

27. A method according to claim 20, which further comprises receiving the test clock signals within a clock converter that includes a clock having a frequency higher than the maximum operating frequency of the integrated circuit to be tested.

28. A method according to claim 20, wherein the clock converter further comprises a counter that counts captured clock signals required by any Automatic Test Pattern Generation (ATPG) program for each test clock.

29. A method according to claim 20, wherein the clock converter further comprises a clock synchronizer applied to received test clock signals and clocked by a fast clock.

30. A method of testing an integrated circuit at operational speed, which comprises:
receiving within a plurality of clock converters test clock signals from a source external to a integrated circuit to be tested and generated at a speed lower than operational speed of the integrated circuit to be tested; and
generating test clock signals from the plurality of clock converters for operational speed testing of the integrated circuit based on the number of received test clock signals, wherein each clock converter for generating test clock signals that are at a different frequency that a respective other clock converter for operational speed testing of the integrated circuit, and further detecting a transition on a clock signal in a logic circuit and detector circuit to bring the clock converter into a capture phase to propagate operational speed clock pulses through an integrated circuit to be tested at a higher speed than the test clock signals from the test clock generator.

31. A method according to claim 30, which further comprises generating test clock signals using an Automatic Test Pattern Generation (ATPG) program.

32. A method according to claim 31, which further comprises creating test patterns from the Automatic Test Pattern Generation (ATPG) program that are propagated without modification at operational speed through the integrated circuit without modification.

33. A method according to claim 30, which further comprises generating test clock signals from Automatic Test Equipment (ATE).

34. A method according to claim 30, which further comprises loading a counter with a number indicative of clock signals during a capture phase based on the number of received test clock signals.

35. A method according to claim 30, which further comprises generating a TRIGGER_FAST-CLK signal and detecting its transition for initiating the generation of the operational speed test clock signals.

36. A method according to claim 30, which further comprises shifting into a shift phase after detecting a negative edge on a TRIGGER_FAST-CLK signal.

37. A method according to claim 30, wherein each clock converter further comprises a counter that counts captured clock signals required by any Automatic Test Pattern Generation (ATPG) program for a test clock.

38. A method according to claim 30, wherein each clock converter further comprises a clock synchronizer applied to received test clock signals and clocked by a fast clock.

* * * * *